United States Patent [19]
Tani et al.

[11] Patent Number: 5,588,983
[45] Date of Patent: Dec. 31, 1996

[54] PRODUCTION OF COPPER POWDER

[75] Inventors: Hiroji Tani; Kazuhito Oshita, both of Nagaokakyo, Japan

[73] Assignee: Murata Manufacturing Co., Ltd., Japan

[21] Appl. No.: 389,285

[22] Filed: Feb. 16, 1995

[30] Foreign Application Priority Data

Feb. 16, 1994 [JP] Japan .................................. 6-019196

[51] Int. Cl.⁶ .................................................. B22F 9/04
[52] U.S. Cl. ......................................... 75/354; 241/16
[58] Field of Search .......................... 75/343, 352, 354; 241/15, 16

[56] References Cited

U.S. PATENT DOCUMENTS 4,884,754 12/1989 Kemp et al. .......................... 241/16

FOREIGN PATENT DOCUMENTS 58-221206 12/1983 Japan .

*Primary Examiner*—George Wyszomierski
*Attorney, Agent, or Firm*—Ostrolenk, Faber, Gerb & Soffen, LLP

[57] ABSTRACT

Finely divided spherical copper powder is produced by ball-milling copper powder together with 0.1 to 3 wt % of stearic acid for 2 to 16 hours.

7 Claims, No Drawings

PRODUCTION OF COPPER POWDER

BACKGROUND OF THE INVENTION

1. Field of the Invention

The present invention relates to production of copper powder and, more particularly, to a method for producing finely divided spherical copper powder for use in conductive pastes.

2. Description of the Prior Art

To the present, conductive pastes have been used for formation of thick film conductors such as electrodes or conductive patterns in multilayered-type electronic parts or multilayered printed circuit boards. For example, internal electrodes of multilayered or monolithic ceramic capacitors are formed by applying a conductive paste on ceramic sheets by screen printing, drying the printed ceramic sheets, and baking them in a non-oxidizing atmosphere such as nitrogen atmosphere or in a weak oxidizing atmosphere.

The recently employed conductive paste includes copper powder dispersed in an organic vehicle along with glass frit. It is required to use copper powder which is free from oxidation and has uniform particle size. If coarse particles are present in the copper powder, they would fill meshes of the printing screen. Further, a wide particle size distribution makes it difficult to form thick film conductors with a uniform thickness. If copper powder oxidizes, it leads to formation of thick film conductor with bad appearance and poor solderability. In addition, since copper powder is gradually oxidized in air, special cares is required for storage of the copper powder.

To solve such problems, it has been proposed to protect copper powder with an antioxidant, for example, by incorporating an antioxidant into a conductive paste containing finely divided copper powder, or by a wet treating process including the steps of immersing finely divided copper powder in a solution of boric acid or stearic acid dissolved in an alcoholic solvent (generally, methyl alcohol) and then heating the wet copper powder after filtration to form a protective coating of boric acid or stearic acid on the copper particles.

However, the above anti-oxidizing treatments of the prior art is time-consuming. In the former process, the antioxidant must be incorporated into a conductive paste prepared by dispersing a previously ground copper powder in an organic vehicle along with glass frit. In the latter wet process which has been put to practice use, it is required to perform the grinding procedure and anti-oxidizing treatment separately. In addition, the wet process leads to the formation of volatile esters, causing the evaporation of boric acid or stearic acid during stirring, mixing and heating steps with the copper powder.

SUMMARY OF THE INVENTION

It is therefore an object of the present invention to provide a method of producing copper powder which overcomes the aforesaid disadvantages and makes it easy to produce finely divided copper powder which is prevented from oxidation even when left in air for a long period of time.

The above and other objects of the present invention are solved by grinding copper powder along with a certain amount of stearic acid in a mill.

According to the present invention, there is provided a method for producing copper powder comprising the steps of adding 0.1 to 3 wt % of stearic acid to copper powder; and ball-milling the resultant mixture so that said copper powder is ground to a fine powder with a particle size ranging from 0.3 to 7 μm. The copper powder is generally ball-milled for 2 to 16 hours.

In the method according to the present invention, stearic acid adheres to copper particles and forms a thin film or a protective coating on the entire surface of each copper particle. The thin film of stearic acid prevents the copper particles from oxidation. Thus, the anti-oxidizing treatment is carried out simultaneously with the grinding operation.

The above and other objects, features and advantages of the present invention will become further apparent from the following preferred examples thereof.

EXAMPLES

Using an alumina pot having a capacity of 1 liter and containing alumina balls with a diameter of about 5 mm, copper powders with a particle size of 0.5 to 20 μm was ground to a fine powder in the following manner. One hundred grams (100 g) of copper powder was placed in the pot together with 0 to 5 percent by weight of stearic acid and then ground to a fine powder by rotating the pot at 60 r.p.m. for 0 to 24 hours.

For each of the resultant copper powders, particle size distribution ($D_{10}$, $D_{50}$, $D_{90}$) was determined with a microtrack particle size analyzer. Results are listed in Table 1 along with the percentage by weight of the stearic acid to the copper powder. Microscopic observation showed that copper particles are coated with stearic acid.

Using the resultant fine copper powders, conductive pastes were prepared by mixing 80 parts by weight of copper powder with 7 parts by weight of lead borosilicate glass frit and 13 parts by weight of an organic vehicle consisting of 8 wt % of ethyl cellulose and 92 wt % of α-terpineol. The conductive pastes were respectively applied on a substrate of alumina by screen process printing, dried at 150° C. for 10 minutes, and then baked at 600 ° C. for 1 hour in a $N_2$ atmosphere to form a thick film conductor on the alumina substrate.

For each resultant thick film conductor, appearance and solderability were evaluated by visual inspection before and after soldering. Results are also shown in Table 1. In this table, an asterisk indicates a specimen out of the scope of the present invention and "sl." is an abbreviation of slightly.

TABLE 1

| No. | Stearic acid (wt %) | Grinding time (h) | Particle size distribution | | | Appearance | Solderability |
| --- | --- | --- | --- | --- | --- | --- | --- |
| | | | $D_{10}$ | $D_{50}$ | $D_{90}$ | | |
| 1 | 0.1 | 8 | 1.1 | 2.7 | 5.1 | good | good |
| 2 | 1.0 | 8 | 1.0 | 2.6 | 5.0 | good | good |
| 3 | 3.0 | 8 | 0.8 | 2.0 | 4.4 | good | good |
| 4 | 1.0 | 2 | 1.5 | 3.5 | 6.6 | good | good |
| 5 | 1.0 | 16 | 0.6 | 1.9 | 4.0 | good | good |
| 6 | 3.0 | 16 | 0.4 | 0.9 | 2.6 | good | good |
| 7* | 0.0 | 0 | 2.9 | 6.3 | 12.3 | bad | bad |
| 8* | 0.0 | 8 | 1.4 | 3.6 | 8.4 | sl. bad | sl. bat |
| 9* | 5.0 | 8 | 0.6 | 1.9 | 4.2 | sl. bad | sl. bad |
| 10* | 1.0 | 24 | 1.3 | 3.0 | 6.0 | sl. bad | sl. bad |

From the results shown in Table 1, it will be seen that the thick film conductor made from the conductive paste containing bare copper powder is poor in appearance and solderability.

In contrast therewith, all the thick film conductors Nos. 1 to 6 made from the conductive paste containing copper powder of the present invention possess good appearance and solderability. From the data for specimen Nos. 1 to 3 and 7 to 9, it will be seen that copper powders ground along with 0.1 to 3.0 wt % of stearic acid is improved in $D_{10}$, $D_{50}$ and $D_{90}$ and enables formation of thick film conductor with good appearance and excellent solderability. If the added amount of stearic acid is less than 0.1 wt %, the addition of stearic acid has no effect on improvement in appearance and solderability though it contributes to produce finely divided copper powder. The solderability of the thick film conductor is improved with an increase in the added amount of stearic acid used for preparation of the finely divided copper powder. However, if the added amount of stearic acid exceeds 3.0 wt %, an excess amount of stearic acid prevents the sintering of copper powder, resulting in a decrease in the appearance and solderability of the thick film conductors.

Separate from the above, the finely-divided copper powder was left to stand for about a half year in air. No oxidation was detected from the particles of the stearic acid-coated copper powder.

Although the present invention has been fully described in connection with the preferred embodiments thereof, it is to be noted that various changes and modifications are apparent to those skilled in the art. Such changes and modifications are to be understood as included within the scope of the present invention as defined by the appended claims unless they depart therefrom.

What is claimed is:

1. A method for producing copper powder comprising the steps of:
   providing a mixture consisting of copper powder and 0.1 to 3 wt % stearic acid; and
   ball milling said mixture until the copper powder has formed a fine powder with a particle size range from 0.3 to 7 microns.

2. The method for producing copper powder according to claim 1 in which the mixture is ball milled for 2 to 16 hours.

3. The method for producing copper powder according to claim 2 in which the mixture is ball milled until the copper powder is a fine powder with a particle size ranging from 0.4 to 6.6 μm.

4. The method for producing copper powder according to claim 2 in which the mixture is ball milled until the copper powder is a fine powder with a particle size ranging from 0.6 to 5.1 μm.

5. The method for producing copper powder according to claim 4 comprising the step of combining and mixing the stearic acid and copper powder.

6. The method for producing copper powder according to claim 2 comprising the step of combining and mixing the stearic acid and copper powder.

7. The method for producing copper powder according to claim 1 comprising the step of combining and mixing the stearic acid and copper powder.

* * * * *